(12) United States Patent
Yamaji et al.

(10) Patent No.: US 8,994,436 B2
(45) Date of Patent: Mar. 31, 2015

(54) SEMICONDUCTOR DEVICE AND RECEIVER

(71) Applicant: Kabushiki Kaisha Toshiba, Minato-ku, Tokyo (JP)

(72) Inventors: Takafumi Yamaji, Kanagawa (JP); Yosuke Ogasawara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/847,728

(22) Filed: Mar. 20, 2013

(65) Prior Publication Data

US 2014/0043088 A1 Feb. 13, 2014

(30) Foreign Application Priority Data

Aug. 13, 2012 (JP) ................. 2012-179210

(51) Int. Cl.
*H03L 7/00* (2006.01)
*G06G 7/14* (2006.01)
*H03F 1/32* (2006.01)

(52) U.S. Cl.
CPC ... *G06G 7/14* (2013.01); *H03F 1/32* (2013.01)
USPC .......................................... 327/362; 330/151

(58) Field of Classification Search
USPC ................. 455/232.1, 251.1; 330/149, 151; 327/560–563, 361–362
See application file for complete search history.

(56) References Cited

U.S. PATENT DOCUMENTS

| 6,844,775 | B2 * | 1/2005 | Doorenbos et al. ............... 330/9 |
| 7,257,385 | B2 * | 8/2007 | Ono et al. .................. 455/232.1 |
| 7,420,410 | B2 | 9/2008 | Ohba |
| 7,804,432 | B2 | 9/2010 | Fukuzawa et al. |
| 8,378,863 | B2 * | 2/2013 | Ishikawa ....................... 341/118 |

FOREIGN PATENT DOCUMENTS

JP 2011-071787 A 4/2011

OTHER PUBLICATIONS

"An I/Q Active Balanced Harmonic Mixer with IM2 Cancelers and a 45° Phase Shifter" Yamaji, T.; Tanimoto,H.; Solid-State Circuits, IEEE Journal of vol. 33; Issue:12 Publication Year:1998, pp. 2240-2246.

* cited by examiner

*Primary Examiner* — Dinh Le
(74) *Attorney, Agent, or Firm* — Holtz, Holtz, Goodman & Chick PC

(57) ABSTRACT

According to one embodiment, there is provided a semiconductor device including a first amplifier and a second amplifier. The first amplifier has an input terminal to receive a first signal and an output terminal to output a second signal. The second amplifier is configured to receive the first signal and a correction data, to generate a correction signal according to the first signal and the correction data, and to output the generated correction signal to the output terminal of the first amplifier so as to add the first signal and the generated correction signal.

20 Claims, 13 Drawing Sheets

US 8,994,436 B2

SEMICONDUCTOR DEVICE AND RECEIVER

CROSS-REFERENCE TO RELATED APPLICATIONS

This application is based upon and claims the benefit of priority from Japanese Patent Application No. 2012-179210, filed on Aug. 13, 2012; the entire contents of which are incorporated herein by reference.

FIELD

Embodiments described herein relate generally to a semiconductor device and a receiver.

BACKGROUND

In the case of a receiver configured to receive radio waves, received signals are amplified in an analog manner by an amplifier, the amplified signals are subjected to predetermined signal processing, and signals (analog signals) obtained from the signal processing are subjected to A/D conversion, thereby obtaining received data. In this case, it is necessary to improve the SN ratio of the obtained signals.

DETAILED DESCRIPTION

It will be understood that when an element is referred to as being "connected" or "coupled" to another element (and/or variations thereof), it can be directly connected or coupled to the other element or intervening elements may be present therebetween. In contrast, when an element is referred to as being "directly connected" or "directly coupled" to another element (and/or variations thereof), there are no intervening elements present therebetween.

In general, according to one embodiment, there is provided a semiconductor device including a first amplifier and a second amplifier. The first amplifier has an input terminal to receive a first signal and an output terminal to output a second signal. The second amplifier is configured to receive the first signal and a correction data, to generate a correction signal according to the first signal and the correction data, and to output the generated correction signal to the output terminal of the first amplifier so as to add the first signal and the generated correction signal.

Exemplary embodiments of a semiconductor device will be explained below in detail with reference to the accompanying drawings. The present invention is not limited to the following embodiments.

First Embodiment

Figure 8:
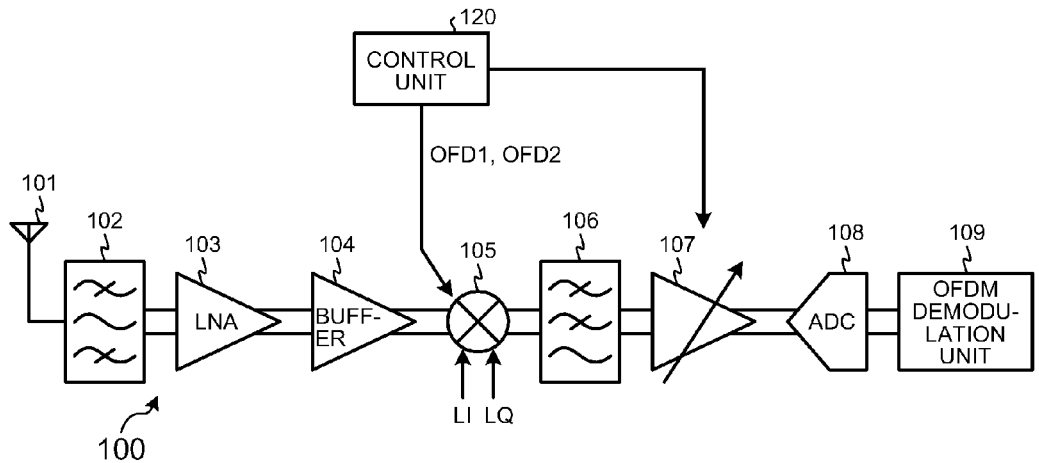
FIG. 8 is a diagram illustrating a configuration of a receiver including a mixer, to which a DA converter according to a basic embodiment is applied.

Prior to describing a DA converter according to a first embodiment, a DA converter 1053 according to a basic embodiment will be described with reference to FIG. 8. FIG. 8 is a diagram illustrating a configuration of a receiver 100 including a mixer 105, to which a DA converter 1053 (see FIG. 9) according to a basic embodiment is applied.

The receiver 100 illustrated in FIG. 8 receives a radio wave (radio frequency signal). Specifically, the receiver 100 includes a receiving antenna 101, a band pass filter 102, a low noise amplifier (LNA) 103, a buffer 104, a mixer 105, a low pass filter 106, a variable gain amplifier 107, an AD converter (ADC) 108, an OFDM (Orthogonal Frequency-Division Multiplexing) demodulation unit 109, and a control unit 120.

The receiving antenna 101 receives a radio wave (radio frequency signal) propagating through the space. The receiving antenna 101 supplies the band pass filter 102 with the received radio frequency signal.

The band pass filter 102 selectively extracts a desired frequency component from the radio frequency signal received by the receiving antenna 101. The band pass filter 102 supplies the low noise amplifier 103 with the extracted radio frequency signal.

The low noise amplifier 103 amplifies the radio frequency signal extracted by the band pass filter 102. The low noise amplifier 103 supplies the buffer 104 with the amplified radio frequency signal.

The buffer 104 further supplies the mixer 105 with the radio frequency signal, which has been supplied from the low noise amplifier 103.

The mixer 105 receives the radio frequency signal, which has been amplified by the low noise amplifier 103, via the buffer 104 and converts the radio frequency signal, in response to local oscillation signals LI, LQ, into a baseband signal or an intermediate frequency signal. At this time, as will be described later, the mixer 105 performs an offset correction operation according to offset correction data OFD1, OFD2 received from the control unit 120. The mixer 105 supplies the low pass filter 106 with the converted signal.

The low pass filter 106 removes any unnecessary high frequency component from the signal supplied from the mixer 105. The low pass filter 106 supplies the variable gain amplifier 107 with the signal, from which the high frequency component has been removed.

The variable gain amplifier 107 amplifies the signal, which has passed through the low pass filter 106. At this time, the variable gain amplifier 107 may amplify the signal using a gain controlled by the control unit 120, for example. The variable gain amplifier 107 supplies the AD converter 108 with the amplified signal.

The AD converter 108 generates a digital value through A/D conversion of the signal supplied from the variable gain amplifier 107. The AD converter 108 supplies the OFDM demodulation unit 109 with the generated digital value.

The OFDM demodulation unit 109 performs OFDM demodulation processing with regard to the supplied digital value. For example, the OFDM demodulation unit 109 restores original data from a multiplexed digital value. The OFDM demodulation unit 109 supplies a predetermined circuit with the restored data.

It is also possible to use a differential signal as the signal transmitted from the band pass filter 102 to the AD converter 108.

Figure 9:
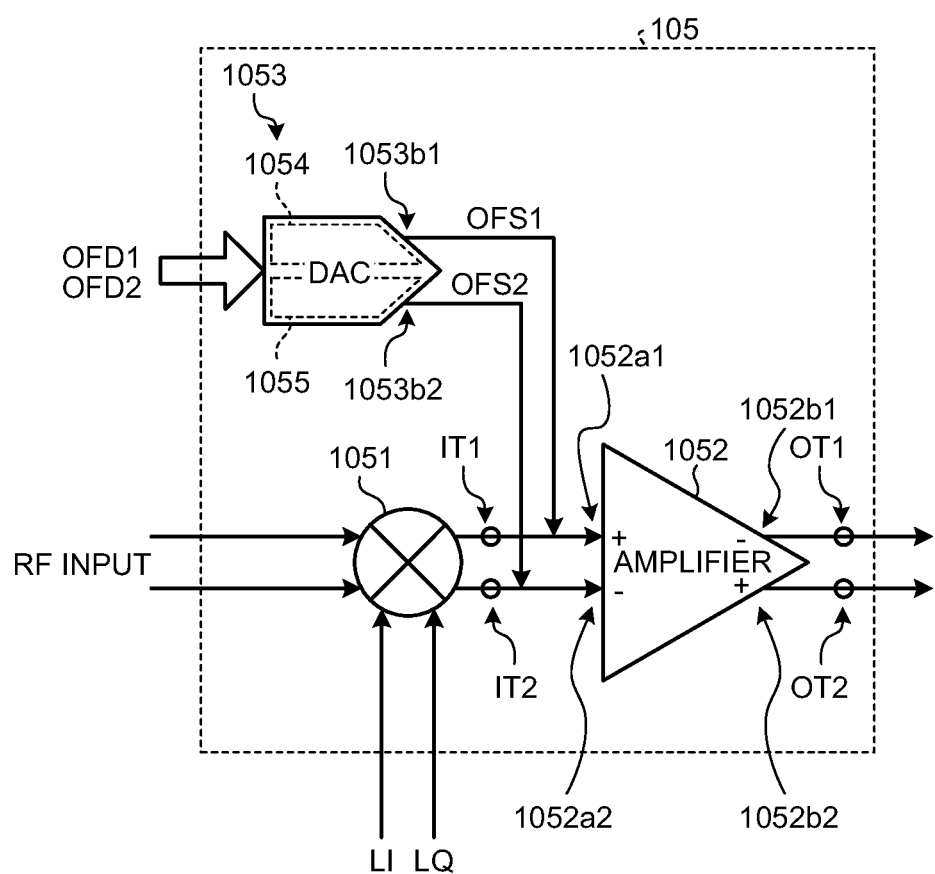
FIG. 9 is a diagram illustrating a configuration of a mixer, to which the DA converter according to the basic embodiment is applied.

Next, an internal configuration of the mixer 105 will be described with reference to FIG. 9. FIG. 9 is a diagram illustrating a configuration of the mixer 105, to which the DA converter 1053 according to the basic embodiment is applied.

The mixer 105 includes a frequency conversion circuit 1051, an amplifier 1052, and a DA converter (DAC) 1053.

The frequency conversion circuit 1051 receives, for example, an amplified radio frequency signal from the low noise amplifier 103 and receives local oscillation signals LI, LQ from a predetermined controller (not illustrated). The frequency conversion circuit 1051 receives, for example, the amplified radio frequency signal in the form of a differential signal.

The frequency conversion circuit 1051 down-converts the amplified radio frequency signal by mixing it with the local oscillation signals LI, LQ, for example, and generates an in-phase component and a quadrature component of a baseband signal. In other words, the frequency conversion circuit 1051 converts the radio frequency signal into a baseband signal or an intermediate frequency. The frequency conversion circuit 1051 supplies the amplifier 1052 with the signal after conversion. The frequency conversion circuit 1051 supplies the amplifier 1052 with the signal after conversion in the form of a differential signal, for example.

The amplifier 1052 amplifies the supplied signal and outputs it. The amplifier 1052 is, for example, a differential amplifier, which receives the supplied signal in the form of a differential signal and outputs the amplified signal in the form of a differential signal.

Specifically, the amplifier 1052 includes a first input terminal IT1, a first input node 1052a1, a second input terminal IT2, a second input node 1052a2, a first output node 1052b1, a first output terminal OT1, a second output node 1052b2, and a second output terminal OT2. The first input node 1052a1 receives a signal of the positive side of a differential signal via the first input terminal IT1. The second input node 1052a2 receives a signal of the negative side of the differential signal via the second input terminal IT2. The first output node 1052b1 outputs the signal of the negative side of the differential signal via the first output terminal OT1. The second output node 1052b2 outputs the signal of the positive side of the differential signal via the second output terminal OT2.

At this time, the signals (for example, differential signals) output from the first output node 1052b1 and the second output node 1052b2 of the amplifier 1052 include offsets of the amplifier 1052.

The DA converter 1053 performs D/A conversion in order to correct offsets of the amplifier 1052. Specifically, the DA converter 1053 includes a first DA converter 1054 and a second DA converter 1055. The first DA converter 1054 corrects a first direct current offset of the amplifier 1052 (differential amplifier). The second DA converter 1055 corrects a second direct current offset of the amplifier 1052 (differential amplifier).

The first DA converter 1054 receives first offset correction data OFD1 from the control unit 120 (see FIG. 8). Then, the first DA converter 1054 performs D/A conversion of the first offset correction data OFD1 to generate a first offset correction signal (analog signal) OFS1 and supplies the amplifier 1052 with it.

The second DA converter 1055 receives second offset correction data OFD2 from the control unit 120 (see FIG. 8). Then, the second DA converter 1055 performs D/A conversion of the second offset correction data OFD2 to generate a second offset correction signal (analog signal) OFS2 and supplies the amplifier 1052 with it.

Also, the offset correction data OFD1, OFD2 has been predetermined experimentally and set in the control unit 120 so as to cancel offsets (first direct current offset, second direct current offset) of the amplifier 1052.

Due to this, the amplifier 1052 amplifies the differential signals received via the first input terminal IT1 and the second input terminal IT2 and also amplifies the first offset correction signal OFS1 and the second offset correction signal OFS2. As a result of this, a signal output from the amplifier 1052 can be made to include, in addition to the offsets of the amplifier 1052, a component that cancels the offsets of the amplifier 1052, thereby enabling reduction of the offsets of the amplifier 1052.

Figure 10:
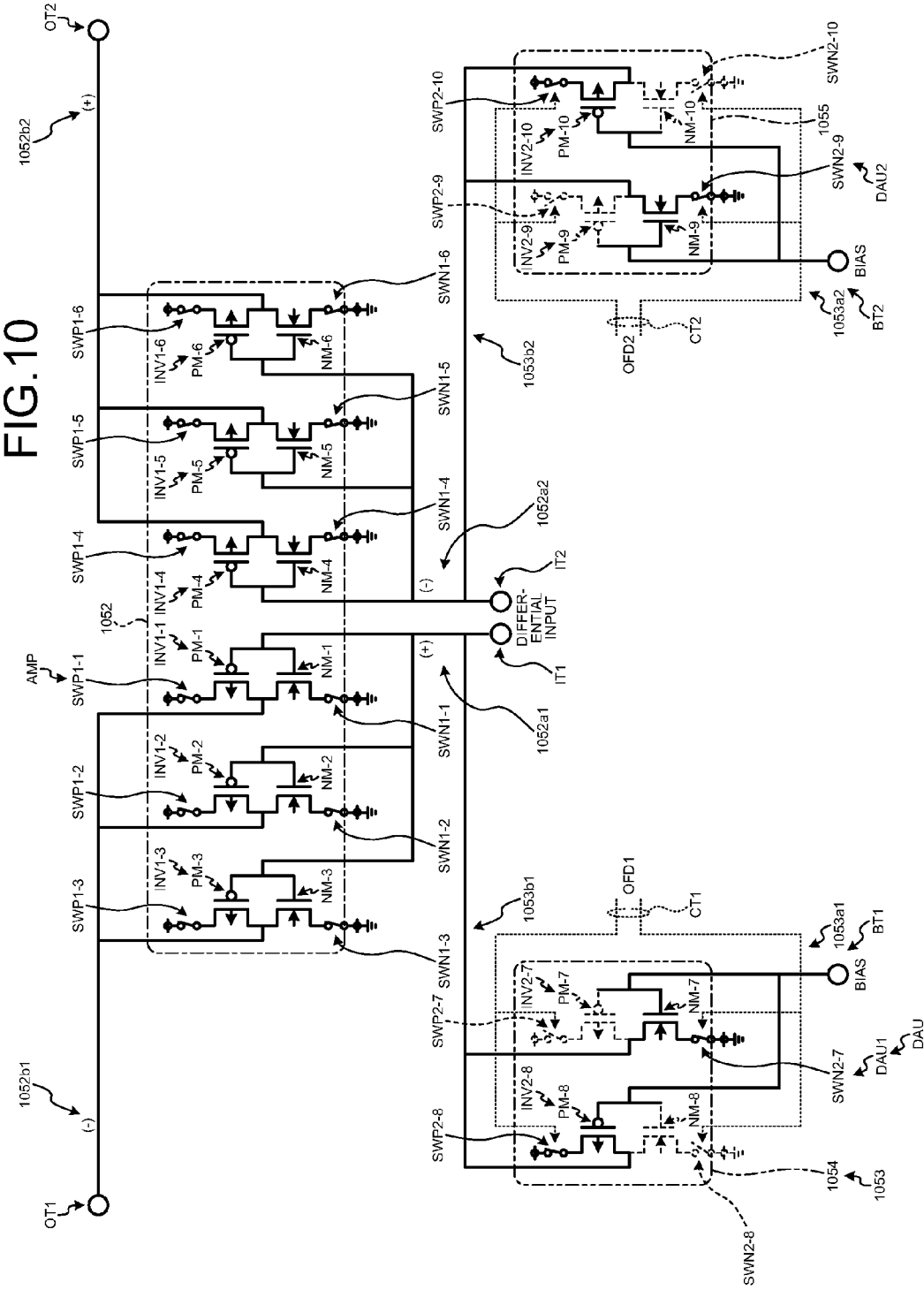
FIG. 10 is a diagram illustrating a configuration of the DA converter according to the basic embodiment.
Figure 11:
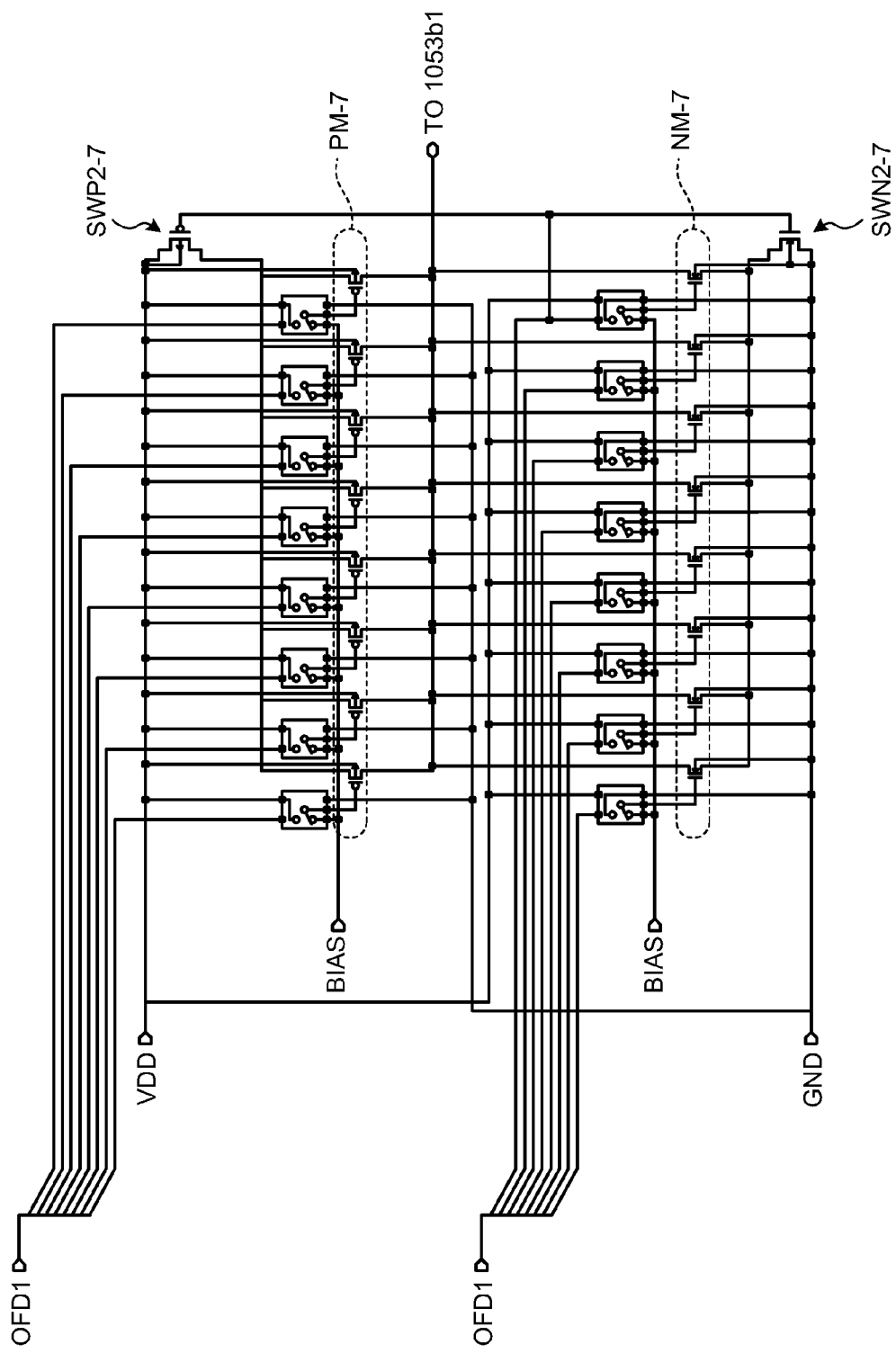
FIG. 11 is a diagram illustrating a configuration of the DA converter according to the basic embodiment.

Next, more specific configurations of the amplifier 1052 and the DA converter 1053 will be described with reference to FIGS. 10 and 11. FIG. 10 is a diagram illustrating a configuration of the DA converter 1053 according to the basic embodiment together with a configuration of the amplifier 1052. FIG. 11 is a diagram illustrating in more detail a configuration of a part of the DA converter 1053 according to the basic embodiment.

The amplifier 1052 includes input terminals IT1, IT2, input nodes 1052a1, 1052a2, an amplification unit AMP, output nodes 1052b1, 1052b2, and output terminals OT1, OT2. The amplification unit AMP is arranged between the input terminals IT1, IT2, the input nodes 1052a1, 1052a2 and the output nodes 1052b1, 1052b2, the output terminals OT1, OT2. The amplification unit AMP includes a plurality of first inverters INV1-1 to INV1-6 and a plurality of pairs of first switches SWP1-1, SWN1-1 to SWP1-6, SWN1-6.

The plurality of first inverters INV1-1 to INV1-6 are connected in parallel with each other between the input terminals and the output terminals. Specifically, the plurality of first inverters INV1-1 to INV1-3 are connected in parallel with each other between the first input terminal IT1 and the first output terminal OT1. The plurality of first inverters INV1-4 to INV1-6 are connected in parallel with each other between the second input terminal IT2 and the second output terminal OT2.

The plurality of pairs of first switches SWP1-1, SWN1-1 to SWP1-6, SWN1-6 connect the plurality of first inverters INV1-1 to INV1-6 to a P-side power source and an N-side power source. For example, the first switch SWP1-1 connects a terminal of the P side of the first inverter INV1-1 to the P-side power source (for example, VDD), the first switch SWN1-1 connects a terminal of the N side of the first inverter INV1-1 to the N-side power source (for example, GND), and the first switch SWP1-1 and the first switch SWN1-1 constitute a pair with each other. For example, the first switch SWP1-6 connects a terminal of the P side of the first inverter INV1-6 to the P-side power source (for example, VDD), the first switch SWN1-6 connects a terminal of the N side of the first inverter INV1-6 to the N-side power source (for example, GND), and the first switch SWP1-6 and the first switch SWN1-6 constitute a pair with each other.

The amplifier 1052 can be configured by deploying a unit cell, which includes a first inverter INV1 and a pair of first switches SWP1, SWN1 connecting the first inverter INV1 to the P-side power source and the N-side power source, with equivalent numbers both on the side of the first input terminal IT1 and on the side of the first input terminal IT2.

The DA converter 1053 includes bias terminals BT1, BT2, input nodes 1053a1, 1053a2, a D/A conversion unit DAU, and output nodes 1053b1, 1053b2. The D/A conversion unit DAU includes a plurality of second inverters INV2-7 to INV2-10 and a plurality of pairs of second switches SWP2-7, SWN2-7 to SWP2-10, SWN2-10.

In other words, the first DA converter 1054 includes a bias terminal BT1, an input node 1053a1, a first D/A conversion unit DAU1, and an output node 1053b1. The first D/A conversion unit DAU1 includes a plurality of second inverters INV2-7, INV2-8 and a plurality of pairs of second switches SWP2-7, SWN2-7, SWP2-8, SWN2-8.

The second DA converter 1055 includes a bias terminal BT2, an input node 1053a2, a second D/A conversion unit DAU2, and an output node 1053b2. The second D/A conversion unit DAU2 includes a plurality of second inverters INV2-9, INV2-10 and a plurality of pairs of second switches SWP2-9, SWN2-9, SWP2-10, SWN2-10.

The plurality of second inverters INV2-7 to INV2-10 are connected in parallel with each other between the bias terminals BT1, BT2 and the input terminals IT1, IT2 of the amplifier 1052. Specifically, the plurality of second inverters INV2-7, INV2-8 are connected in parallel with each other between the first bias terminal BT1 and the output node 1053b1. The output node 1053b1 is connected between the first input terminal IT1 and the first input node 1052a1 of the amplifier 1052. The plurality of second inverters INV2-9, INV2-10 are connected in parallel with each other between the second bias terminal BT2 and the output node 1053b2. The output node 1053b2 is connected between the second input terminal IT2 and the second input node 1052a2 of the amplifier 1052.

The plurality of pairs of second switches SWP2-7, SWN2-7 to SWP2-10, SWN2-10 connect the plurality of second inverters INV2-7 to INV2-10 to the P-side power source and the N-side power source. For example, the second switch SWP2-7 connects a terminal of the P side of the second inverter INV2-7 to the P-side power source (for example, VDD), the second switch SWN2-7 connects a terminal of the N side of the second inverter INV2-7 to the N-side power source (for example, GND), and the second switch SWP2-7 and the second switch SWN2-7 constitute a pair with each other. For example, the second switch SWP2-10 connects a terminal of the P side of the second inverter INV2-10 to the P-side power source (for example, VDD), the second switch SWN2-10 connects a terminal of the N side of the second inverter INV2-10 to the N-side power source (for example, GND), and the second switch SWP2-10 and the second switch SWN2-10 constitute a pair with each other.

The DA converter 1053 can be configured by deploying a unit cell, which includes a second inverter INV2 and a pair of second switches SWP2, SWN2 connecting the second inverter INV2 to the P-side power source and the N-side power source, with equivalent numbers both on the side of the first input terminal IT1 (side of the first DA converter 1054) and on the side of the second input terminal IT2 (side of the second DA converter 1055).

In the case of the configuration illustrated in FIG. 10, with regard to each of the plurality of first inverters INV1-1 to INV1-6 and the plurality of second inverters INV2-7 to INV2-10, a PMOS transistor PM and an NMOS transistor NM are inverter-connected. For example, with regard to the first inverter INV1-1, a PMOS transistor PM-1 and an NMOS transistor NM-1 are inverter-connected. For example, with regard to the first inverter INV1-6, a PMOS transistor PM-6 and an NMOS transistor NM-6 are inverter-connected. For example, with regard to the second inverter INV2-7, a PMOS transistor PM-7 and an NMOS transistor NM-7 are inverter-connected. For example, with regard to the second inverter INV1-10, a PMOS transistor PM-10 and an NMOS transistor NM-10 are inverter-connected.

According to the configuration illustrated in FIG. 10, the amplifier 1052, when performing an amplification operation, turns on both of each pair of the plurality of pairs of first switches SWP1-1, SWN1-1 to SWP1-6, SWN1-6.

In contrast, the DA converter 1053 responds to offset correction data received at the control terminal and turns on one of each pair of the plurality of pairs of second switches SWP2-7, SWN2-7 to SWP2-10, SWN2-10. In other words, the first DA converter 1054 responds to first offset correction data OFD1 received at the first control terminal CT1, turns on one of the second switches SWP2-7, SWN2-7, which constitute a pair, and turns on one of the second switches SWP2-8, SWN2-8, which constitute a pair. The second DA converter 1055 responds to second offset correction data OFD2 received at the second control terminal CT2, turns on one of the second switches SWP2-9, SWN2-9, which constitute a pair, and turns on one of the second switches SWP2-10, SWN2-10, which constitute a pair. FIG. 10 illustrates a case in which the DA converter 1053 has turned on the switches SWN2-7, SWP2-8, SWN2-9, SWP2-10 and has turned off the switches SWP2-7, SWN2-8, SWP2-9, SWN2-10.

In response to this, in the case of the DA converter 1053, in response to offset correction data received at the control terminal, one of the PMOS transistor PM and the NMOS transistor NM of each of the second inverters INV2-7 to INV2-10 is activated, and the other is deactivated. In FIG. 10, deactivated states are indicated by broken lines. The activated transistors operate as current sources and supply the amplifier 1052 with the generated currents as offset correction signals. At this time, on the side of the first output terminal OT1, for example, activation of the PMOS transistor PM draws a current from the P-side power source (for example, VDD) and increases the current value, while activation of the NMOS transistor NM draws a current from the N-side power source (for example, GND) and decreases the current value. In other words, the PMOS transistor PM and the NMOS transistor NM of each of the second inverters INV2-7 to INV2-10 are activated/deactivated so as to correspond to the on/off states of the plurality of pairs of second switches, which respond to offset correction data (digital signals), D/A conversion is performed in the states, and the D/A conversion result (for example, current) is output as an offset correction signal (analog signal) from the DA converter.

In the case illustrated in FIG. 10, for example, in the first DA converter 1054, a current generated by the NMOS transistor NM-7 and a current generated by the PMOS transistor PM-8 are added in response to first offset correction data OFD1, and the added current is supplied as a first offset correction signal OFS1 (see FIG. 9) from the output node 1053b1 to the first input node 1052a1 of the amplifier 1052. In the second DA converter 1055, furthermore, a current generated by the NMOS transistor NM-9 and a current generated by the PMOS transistor PM-10 are added in response to second offset correction data OFD2, and the added current is supplied as a second offset correction signal OFS2 (see FIG. 9) from the output node 1053b2 to the second input node 1052a2 of the amplifier 1052.

At this time, the transistors operating as current sources are, as a matter of fact, configured by parallel connection of a number of transistors, as illustrated in FIG. 11 for example, and noise occurs due to variations of characteristics of respective transistors. In other words, even when transistors of similar characteristics (for example, similar gate widths and gate lengths) are used by design requirements between the PMOS transistors PM-1 to PM-6 related to the first inverters INV1-1 to INV1-6 and the PMOS transistors PM-7 to PM-10 related to the second inverters INV2-7 to INV2-10, actual characteristics tend to vary, creating a possibility that noise will occur due to the variations of characteristics. Likewise, even when transistors of similar characteristics (for example, similar gate widths and gate lengths) are used by design requirements between the NMOS transistors NM-1 to NM-6 related to the first inverters INV1-1 to INV1-6 and the NMOS transistors NM-7 to NM-10 related to the second inverters INV2-7 to INV2-10, actual characteristics tend to vary, creating a possibility that noise will occur due to the variations of characteristics. As a result of this, the offset correction signals OFS1, OFS2 supplied to the input side of the amplifier 1052 include, besides a component that contributes to offset correction, a noise component.

Therefore, when the amplifier 1052 amplifies the first offset correction signal OFS1 and the second offset correction signal OFS2 together with the differential signal, not only the component that cancels the offset of the amplifier 1052, but also the noise component are amplified, meaning that the signal that is output from the first output terminal OT1 and the second output terminal OT2 as an output of the mixer 105 includes a component corresponding to the amplified noise component, and the SN ratio tends to worsen.

Figure 12:
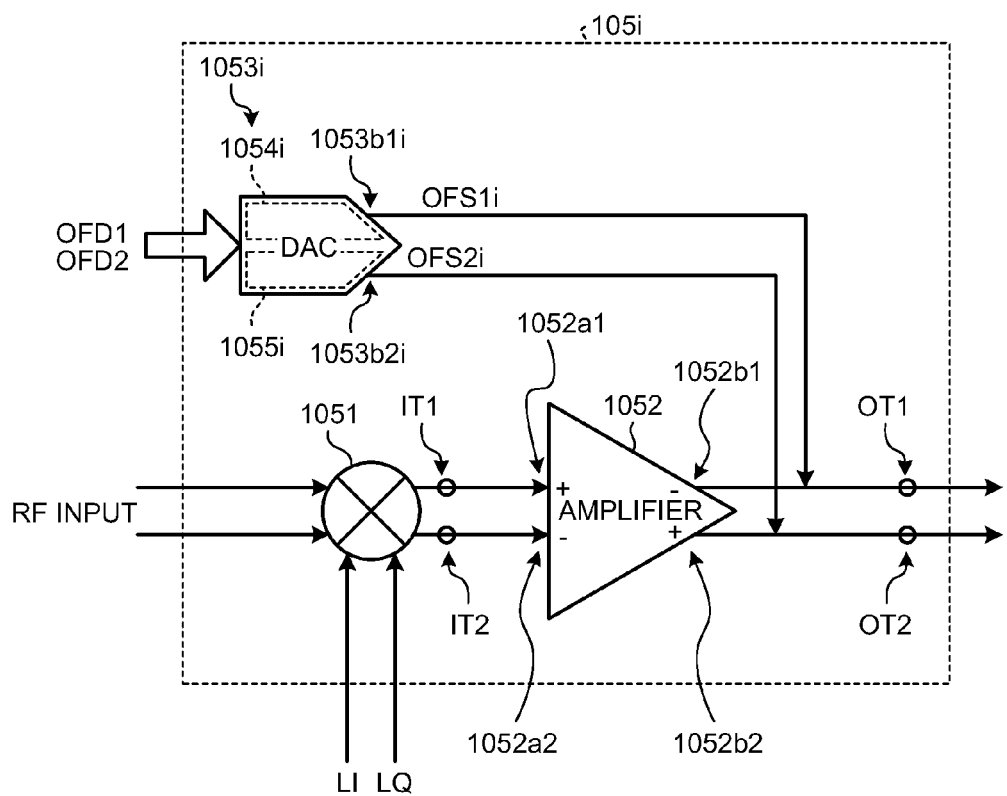
FIG. 12 is a diagram illustrating a configuration of a mixer, to which a DA converter according to a variant of the basic embodiment is applied.

Therefore, the present inventor has conducted researches concerning improvement of the SN ratio. The result of researches has led to the idea of changing the location of connection of the output nodes 1053b1i, 1053b2i of the DA converter 1053i, as illustrated in FIG. 12, from between the input terminals IT1, IT2 of the amplifier 1052 and the input nodes 1052a1, 1052a2 (see FIG. 9) to between the output nodes 1052b1, 1052b2 of the amplifier 1052 and the output terminals OT1, OT2. FIG. 12 is a diagram illustrating a configuration of a mixer 105i including a DA converter 1053i according to a variant of the basic embodiment. The following description will focus on parts different from those of the mixer 105 including the DA converter 1053 according to the basic embodiment (see FIGS. 9 to 11).

In the case of the mixer 105i, as illustrated in FIG. 12, the DA converter 1053i and the amplifier 1052 share the output terminals OT1, OT2. In other words, the first DA converter 1054i and the amplifier 1052 share the output terminal OT1. The second DA converter 1055i and the amplifier 1052 share the output terminal OT2.

Figure 13:
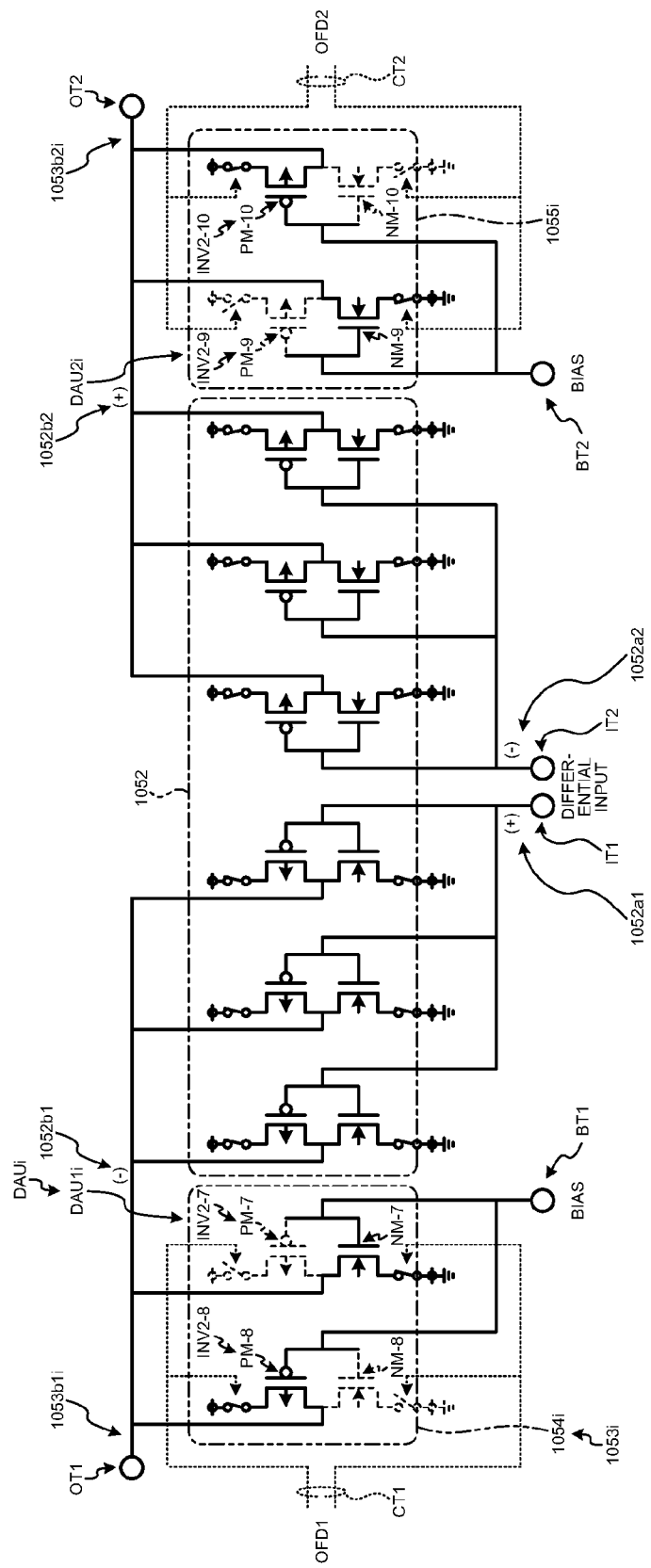
FIG. 13 is a diagram illustrating a configuration of the DA converter according to the variant of the basic embodiment.

Specifically, the configuration illustrated in FIG. 10 is changed into the configuration illustrated in FIG. 13. In the configuration illustrated in FIG. 13, a plurality of second inverters INV2-7 to INV2-10 of a D/A conversion unit DAUi of the DA converter 1053i are connected in parallel with each other between the bias terminals BT1, BT2 and the output terminals OT1, OT2 of the amplifier 1052.

More specifically, a plurality of second inverters INV2-7, INV2-8 of the first D/A conversion unit DAU1i of the first DA converter 1054i are connected in parallel with each other between the first bias terminal BT1 and the output node 1053b1i. The output node 1053b1i is connected between the first output node 1052b1 of the amplifier 1052 and the first output terminal OT1. A plurality of second inverters INV2-9, INV2-10 of the second D/A conversion unit DAU2i of the second DA converter 1055i are connected in parallel with each other between the second bias terminal BT2 and the output node 1053b2i. The output node 1053b2i is connected between the second output node 1052b2 of the amplifier 1052 and the second output terminal OT2.

According to the configuration illustrated in FIG. 13, in the case illustrated in FIG. 13, for example, in the first DA converter 1054i, a current generated by the NMOS transistor NM-7 and a current generated by the PMOS transistor PM-8 are added in response to first offset correction data OFD1, and the added current is supplied as a first offset correction signal OFS1i (see FIG. 12) from the output node 1053b1i to the output terminal OT1 of the amplifier 1052. In the second DA converter 1055i, furthermore, a current generated by the NMOS transistor NM-9 and a current generated by the PMOS transistor PM-10 are added in response to second offset correction data OFD2, and the added current is supplied as a second offset correction signal OFS2i (see FIG. 12) from the output node 1053b2i to the output terminal OT2 of the amplifier 1052.

Due to this, the amplifier 1052 amplifies the differential signal, and the first offset correction signal OFS1i and the second offset correction signal OFS2i are added to the signal after amplification, respectively, and are output from the first output terminal OT1 and the second output terminal OT2 as outputs of the mixer 105, respectively. At this time, the amplifier 1052 does not amplify the first offset correction signal OFS1i and the second offset correction signal OFS2i, thereby making it possible to suppress amplification of noise components included in the first offset correction signal OFS1i and the second offset correction signal OFS2i. In other words, the configuration illustrated in FIGS. 12 and 13 can decrease, compared with the configuration illustrated in FIGS. 9 and 10, noise components included in signals output from the first output terminal OT1 and the second output terminal OT2 as outputs of the mixer 105 and thus improve the SN ratio.

Figure 1:
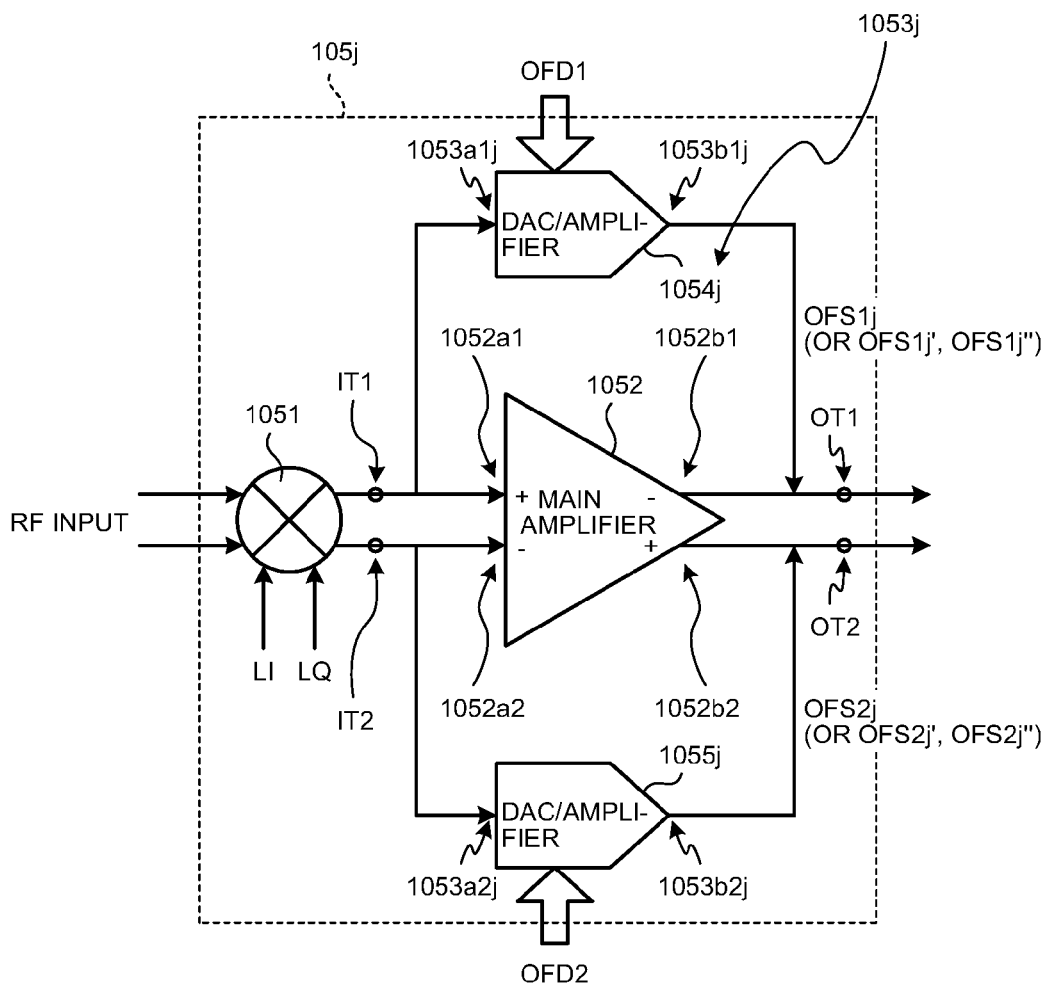
FIG. 1 is a diagram illustrating a configuration of a mixer, to which a DA converter according to a first embodiment is applied.

In connection with this, the present inventor has performed researches regarding further improvement of the SN ratio. The result of researches has led to the idea, as illustrated in FIG. 1, of using a DA converter 1053j (first DA converter 1054j, second DA converter 1055j) of a mixer 105j, which is for the purpose of offset correction, also for the purpose of amplification of a differential signal. FIG. 1 is a diagram illustrating a configuration of a mixer 105j including a DA converter 1053j according to a first embodiment. The following description will focus on parts different from those of the mixer 105 including the DA converter 1053 according to the basic embodiment (see FIGS. 9 to 11) and from those of the mixer 105i including the DA converter 1053i according to a variant of the basic embodiment (see FIGS. 12 and 13).

In the case of the mixer 105j, as illustrated in FIG. 1, the DA converter 1053j and the amplifier 1052 share the output terminals OT1, OT2 and also share the input terminals IT1, IT2. In other words, the first DA converter 1054j and the amplifier 1052 share the output terminal OT1 and also share the input terminal IT1. The second DA converter 1054j and the amplifier 1052 share the output terminal OT2 and also share the input terminal IT2.

Figure 2:
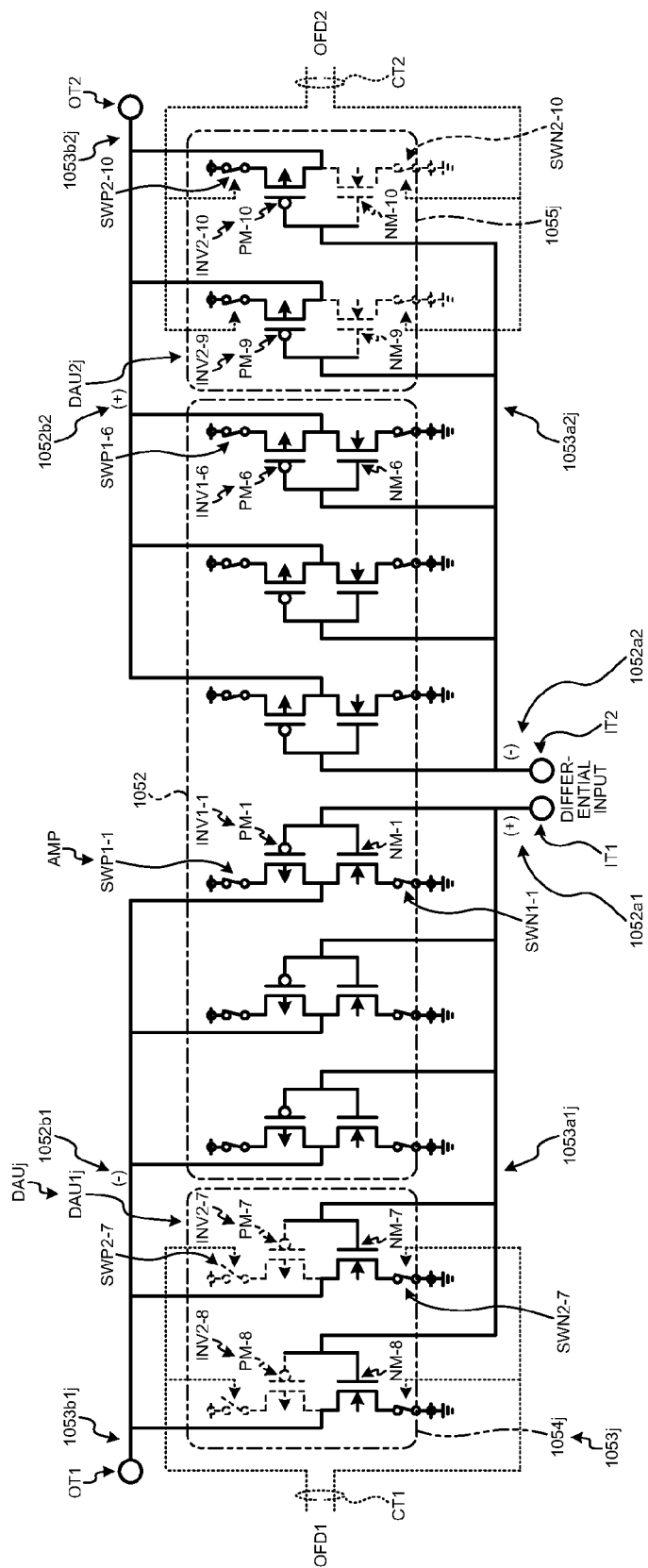
FIG. 2 is a diagram illustrating a configuration and an operation of the DA converter according to the first embodiment.

Specifically, the configuration illustrated in FIG. 13 is changed into the configuration illustrated in FIG. 2. In the configuration illustrated in FIG. 2, a plurality of second inverters INV2-7 to INV2-10 of a D/A conversion unit DAUj of the DA converter 1053j are connected in parallel with each other between the input terminals IT1, IT2 and the output terminals OT1, OT2 of the amplifier 1052.

More specifically, a plurality of second inverters INV2-7, INV2-8 of the first D/A conversion unit DAU1$j$ of the first DA converter 1054$j$ are connected in parallel with each other between the input node 1053$a$1$j$ and the output node 1053$b$1$j$. The input node 1053$a$1$j$ is connected to the first input node 1052$a$1 of the amplifier 1052 and the first input terminal IT1. The output node 1053$b$1$i$ is connected between the first output node 1052$b$1 of the amplifier 1052 and the first output terminal OT1. A plurality of second inverters INV2-9, INV2-10 of the second D/A conversion unit DAU2$j$ of the second DA converter 1055$j$ are connected in parallel with each other between the input node 1053$a$2$j$ and the output node 1053$b$2$j$. The input node 1053$a$2$j$ is connected to the second input node 1052$a$2 of the amplifier 1052 and the second input terminal IT2. The output node 1053$b$2$i$ is connected between the second output node 1052$b$2 of the amplifier 1052 and the second output terminal OT2.

According to the configuration illustrated in FIG. 2, in the case illustrated in FIG. 2, for example, in the first DA converter 1054$j$, a current generated by the NMOS transistor NM-7 and a current generated by the NMOS transistor NM-8 are added in response to first offset correction data OFD1, and the added current is supplied as a first offset correction signal OFS1$j$ (see FIG. 1) from the output node 1053$b$1$j$ to the output terminal OT1 of the amplifier 1052. In the second DA converter 1055$j$, furthermore, a current generated by the NMOS transistor NM-9 and a current generated by the NMOS transistor NM-10 are added in response to second offset correction data OFD2, and the added current is supplied as a second offset correction signal OFS2$j$ (see FIG. 1) from the output node 1053$b$2$j$ to the output terminal OT2 of the amplifier 1052.

Figure 3:
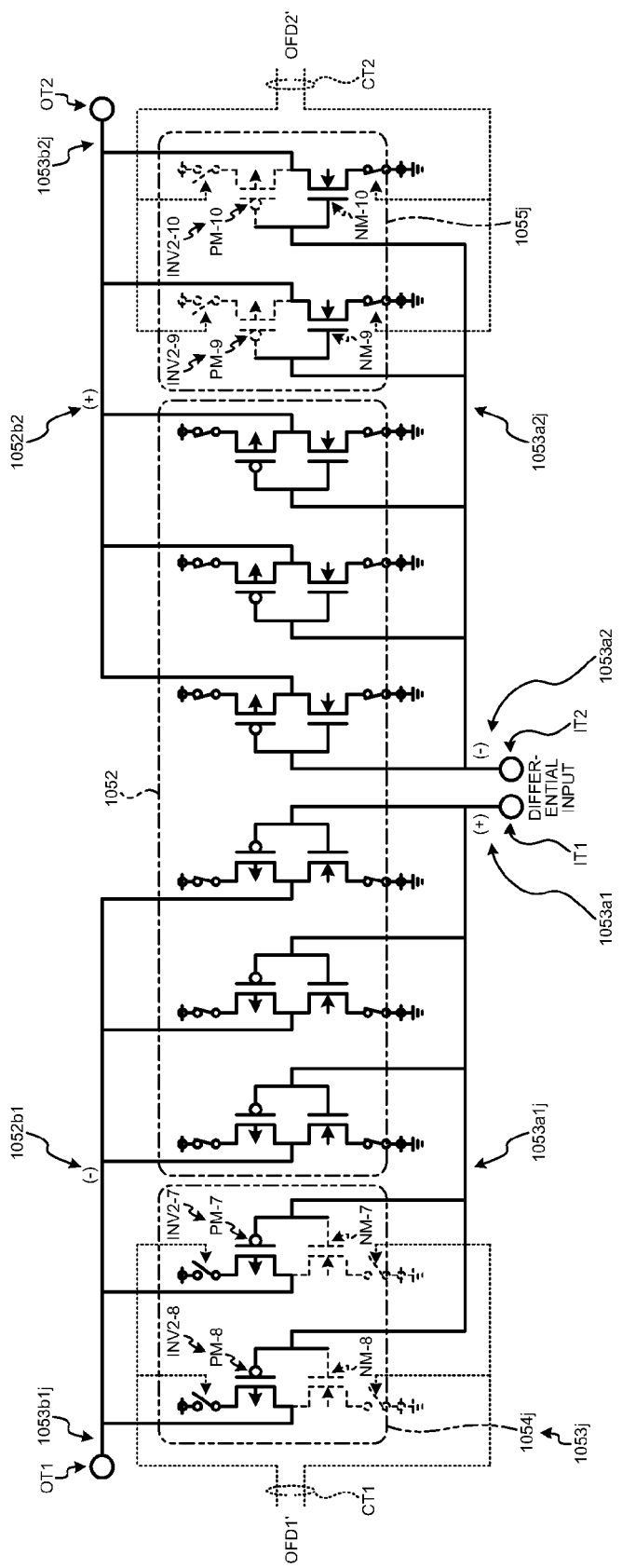
FIG. 3 is a diagram illustrating an operation of the DA converter according to the first embodiment.

Alternatively, in the case illustrated in FIG. 3 for example, in the first DA converter 1054$j$, a current generated by the PMOS transistor PM-7 and a current generated by the PMOS transistor PM-8 are added in response to first offset correction data OFD1', and the added current is supplied as a first offset correction signal OFS1$j$' (see FIG. 1) from the output node 1053$b$1$j$ to the output terminal OT1 of the amplifier 1052. In the second DA converter 1055$j$, furthermore, a current generated by the PMOS transistor PM-9 and a current generated by the PMOS transistor PM-10 are added in response to second offset correction data OFD2', and the added current is supplied as a second offset correction signal OFS2$j$' (see FIG. 1) from the output node 1053$b$2$j$ to the output terminal OT2 of the amplifier 1052.

A comparison between the case illustrated in FIG. 2 and the case illustrated in FIG. 3 is as follows: in the case illustrated in FIG. 2, two NMOS transistors NM-7, NM-8 are activated, and the first offset correction signal OFS1$j$ is generated in such a direction that the voltage of the output terminal OT1 decreases; in the case illustrated in FIG. 3, in contrast, two PMOS transistors PM-7, PM-8 are activated, and the first offset correction signal OFS1$j$' is generated in such a direction that the voltage of the output terminal OT1 increases. In other words, it is thought that the first offset correction data OFD1' illustrated in FIG. 3 has a bit value larger than that of the first offset correction data OFD1 illustrated in FIG. 2, and, in accordance with this, the first offset correction signal OFS1$j$' illustrated in FIG. 3 has an analog value (current value) larger than that of the first offset correction signal OFS1$j$ illustrated in FIG. 2. Likewise, it is thought that the second offset correction data OFD2' illustrated in FIG. 3 has a bit value (negative value) smaller than that of the second offset correction data OFD2 illustrated in FIG. 2, and, in accordance with this, the second offset correction signal OFS2$j$' illustrated in FIG. 3 has an analog value (current value) larger than that of the second offset correction signal OFS2$j$ illustrated in FIG. 2.

Figure 4:
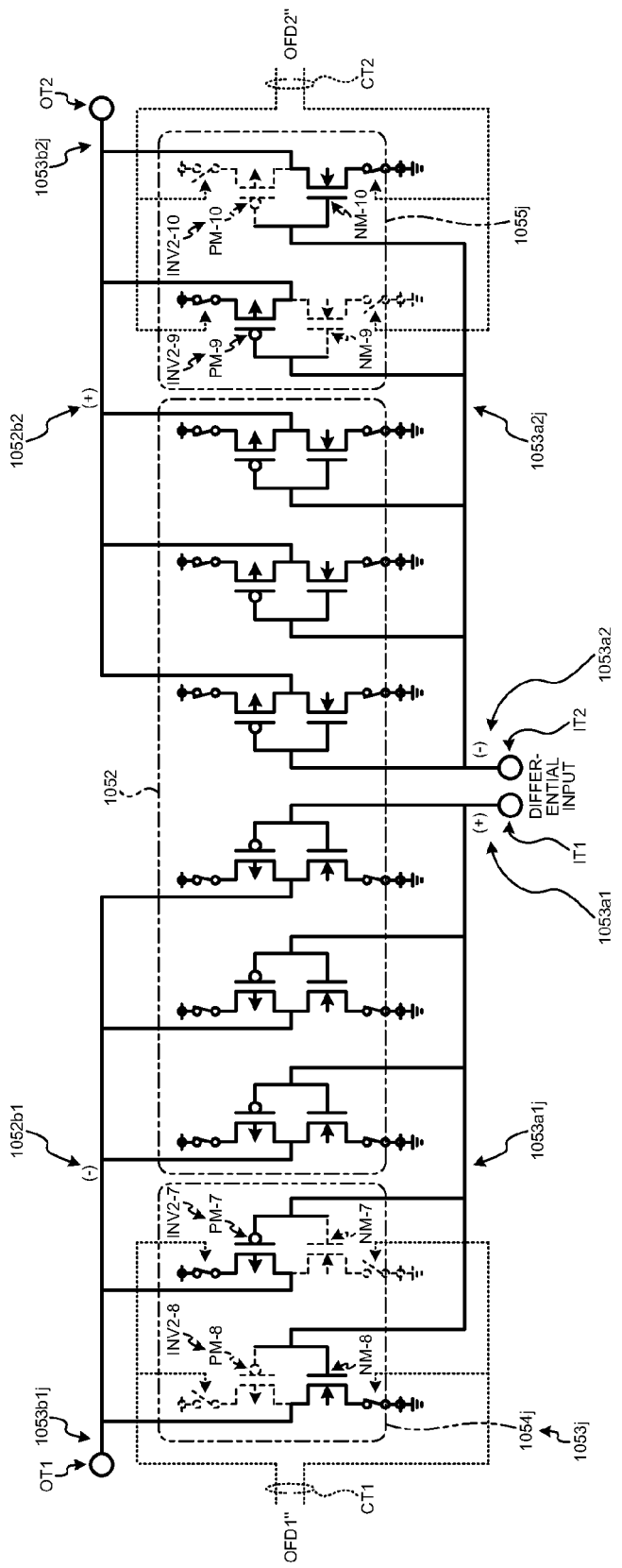
FIG. 4 is a diagram illustrating an operation of the DA converter according to the first embodiment.

Alternatively, in the case illustrated in FIG. 4 for example, in the first DA converter 1054$j$, a current generated by the PMOS transistor PM-7 and a current generated by the NMOS transistor NM-8 are added in response to first offset correction data OFD1", and the added current is supplied as a first offset correction signal OFS1$j$'" (see FIG. 1) from the output node 1053$b$1$j$ to the output terminal OT1 of the amplifier 1052. In the second DA converter 1055$j$, furthermore, a current generated by the PMOS transistor PM-9 and a current generated by the NMOS transistor NM-10 are added in response to second offset correction data OFD2", and the added current is supplied as a second offset correction signal OFS2$j$'" (see FIG. 1) from the output node 1053$b$2$j$ to the output terminal OT2 of the amplifier 1052.

A comparison between the case illustrated in FIG. 2 and the case illustrated in FIG. 4 is as follows: in the case illustrated in FIG. 2, two NMOS transistors NM-7, NM-8 are activated, and the first offset correction signal OFS1$j$ is generated in such a direction that the voltage of the output terminal OT1 decreases; in the case illustrated in FIG. 4, in contrast, one PMOS transistor PM-7 and one NMOS transistor NM-8 are activated, and currents of PM-7 and NM-8 counterbalance each other, so that the voltage of the output terminal OT1 hardly changes, and a first offset correction signal OFS1$j$'" of a remarkably small amplitude is generated. In other words, it is thought that the first offset correction data OFD1" illustrated in FIG. 4 has a bit value larger than that of the first offset correction data OFD1 (negative value) illustrated in FIG. 2, and, in accordance with this, the first offset correction signal OFS1$j$'" illustrated in FIG. 4 has an analog value (current value) larger than that of the first offset correction signal OFS1$j$ illustrated in FIG. 2. Likewise, it is thought that the second offset correction data OFD2" illustrated in FIG. 4 has a bit value smaller than that of the second offset correction data OFD2 illustrated in FIG. 2, and, in accordance with this, the second offset correction signal OFS2$j$'" illustrated in FIG. 4 has an analog value (current value) smaller than that of the second offset correction signal OFS2$j$ illustrated in FIG. 2.

Furthermore, a comparison between the case illustrated in FIG. 3 and the case illustrated in FIG. 4 is as follows: in the case illustrated in FIG. 3, two PMOS transistors PM-7, PM-8 are activated, and a first offset correction signal OFS1$j$ of a comparatively large current value is generated; in the case illustrated in FIG. 4, in contrast, one PMOS transistor PM-7 and one NMOS transistor NM-8 are activated, and a first offset correction signal OFS1$j$'" of a smaller current value is generated. In other words, it is thought that the first offset correction data OFD1" illustrated in FIG. 4 has a bit value smaller than that of the first offset correction data OFD1' illustrated in FIG. 3, and, in accordance with this, the first offset correction signal OFS1$j$'" illustrated in FIG. 4 has an analog value (current value) smaller than that of the first offset correction signal OFS1$j$' illustrated in FIG. 3. Likewise, it is thought that the second offset correction data OFD2" illustrated in FIG. 4 has a bit value larger than that of the second offset correction data OFD2' illustrated in FIG. 3, and, in accordance with this, the second offset correction signal OFS2$j$'" illustrated in FIG. 4 has an analog value (current value) larger than that of the second offset correction signal OFS2$j$' (negative value) illustrated in FIG. 3.

In other words, the case illustrated in FIG. 4 corresponds to a case of generating an intermediate value (intermediate point) between the case illustrated in FIG. 2 and the case illustrated in FIG. 3.

Figure 5A:
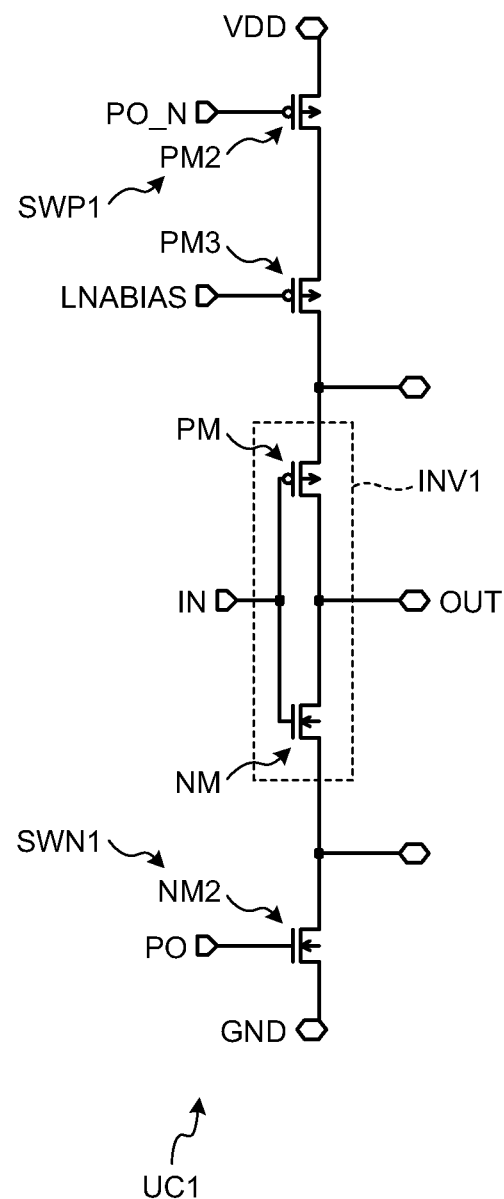
FIGS. 5A and 5B are diagrams illustrating unit cells of an amplifier and the DA converter according to the first embodiment, respectively.
Figure 5B:
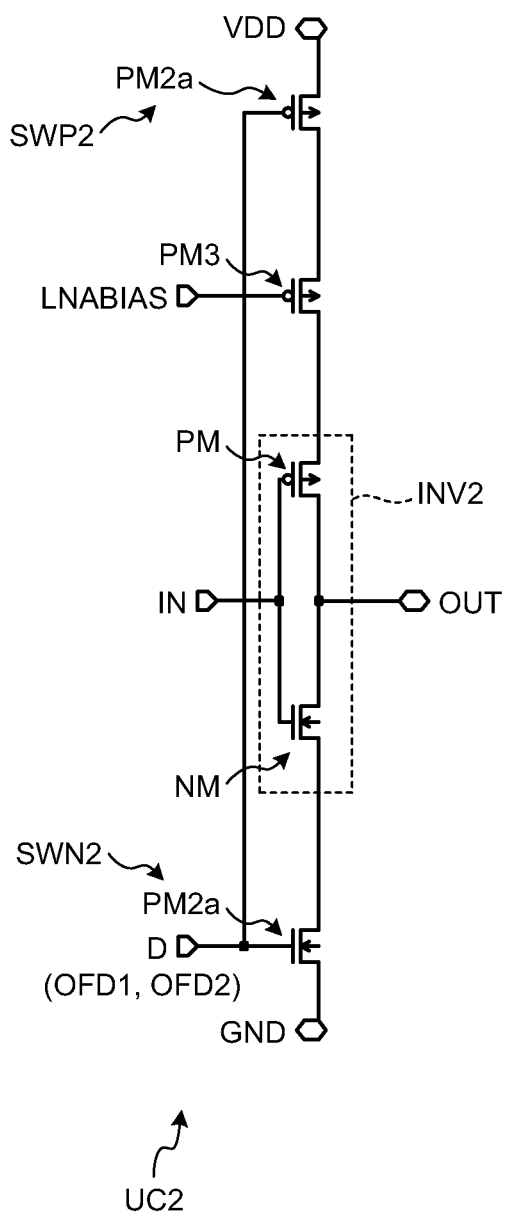

Next, more specific configurations of unit cells of the amplifier 1052 and the DA converter 1053*j* will be described with reference to FIGS. 5A and 5B. FIG. 5A is a diagram illustrating a unit cell of the amplifier 1052. FIG. 5B is a diagram illustrating a unit cell of the DA converter 1053*j*.

The amplifier 1052 can be configured, as described above, by deploying a unit cell UC1, which includes a first inverter INV1 and a pair of first switches SWP1, SWN1 connecting the first inverter INV1 to the P-side power source and the N-side power source, with equivalent numbers both on the side of the first input terminal IT1 and on the side of the first input terminal IT2. For example, FIG. 2 illustrates a configuration of a case in which three unit cells UC1 are deployed both on the side of the first input terminal IT1 and on the side of the first input terminal IT2, respectively.

In the case of the unit cell UC1, as illustrated in FIG. 5A for example, the P-side end of the first inverter INV1 is connected to a power source potential VDD (P-side power source) via a PMOS transistor PM3 and a PMOS transistor PM2. The PMOS transistor PM3 serves as an auxiliary current source for stably operating the first inverter INV1 and generates a current in response to a control signal LNABIAS supplied to the gate. The PMOS transistor PM2 serves as a first switch SWP1 of the P side so that it is turned on when a control signal PO_N of an active level is supplied to the gate, and connects the P-side end of the first inverter INV1 to the power source potential VDD; or it is turned off when a control signal PO_N of a non-active level is supplied to the gate, and electrically insulates the P-side end of the first inverter INV1 from the power source potential VDD.

The N-side end of the first inverter INV1 is connected to a ground potential GND (N-side power source) via an NMOS transistor NM2. The NMOS transistor NM2 serves as a first switch SWN1 of the N side so that it is turned on when a control signal PO of an active level is supplied to the gate, and connects the N-side end of the first inverter INV1 to the ground potential GND; or it is turned off when a control signal PO of a non-active level is supplied to the gate, and electrically insulates the N-side end of the first inverter INV1 from the ground potential GND.

In this case, the control signal PO_N is a logical inverse of the control signal PO. At this time, the control signal PO_N is a low-active signal, and the control signal PO is a high-active signal, so that the control signal PO_N and the control signal PO simultaneously reach active levels. In other words, when the amplifier 1052 operates, the control signal PO_N and the control signal PO simultaneously reach active levels, and both of the pair of first switches SWP1, SWN1 are turned on.

Furthermore, the DA converter 1053*j* can be configured, as described above, by deploying a unit cell UC2, which includes a second inverter INV2 and a pair of second switches SWP2, SWN2 connecting the second inverter INV2 to the P-side power source and the N-side power source, with equivalent numbers both on the side of the first input terminal IT1 (side of the first DA converter 1054) and on the side of the second input terminal IT2 (side of the second DA converter 1055). For example, FIG. 2 illustrates a configuration of a case in which two unit cells UC1 are deployed both on the side of the first input terminal IT1 (side of the first DA converter 1054) and on the side of the second input terminal IT2 (side of the second DA converter 1055), respectively.

In the case of the unit cell UC2, as illustrated in FIG. 5B for example, the P-side end of the second inverter INV2 is connected to a power source potential VDD (P-side power source) via a PMOS transistor PM3 and a PMOS transistor PM2*a*. The PMOS transistor PM3 serves as an auxiliary current source for stably operating the second inverter INV2 and generates a current in response to a control signal LNABIAS supplied to the gate. The PMOS transistor PM2*a* serves as a second switch SWP2 of the P side. The PMOS transistor PM2*a* is turned on when a control signal D of an active level is supplied to the gate, and connects the P-side end of the second inverter INV2 to the power source potential VDD, thereby activating the PMOS transistor PM of the second inverter INV2. The PMOS transistor PM2*a* is turned off when a control signal D of a non-active level is supplied to the gate, and electrically insulates the P-side end of the second inverter INV2 from the power source potential VDD, thereby deactivating the PMOS transistor PM of the second inverter INV2.

The N-side end of the second inverter INV2 is connected to a ground potential GND (N-side power source) via an NMOS transistor NM2*a*. The NMOS transistor NM2*a* serves as a second switch SWN2 of the N side. The NMOS transistor NM2*a* is turned on when a control signal D of an active level is supplied to the gate, and connects the N-side end of the second inverter INV2 to the ground potential GND, thereby activating the NMOS transistor NM of the second inverter INV2. The NMOS transistor NM2*a* is turned off when a control signal D of a non-active level is supplied to the gate, and electrically insulates the N-side end of the second inverter INV2 from the ground potential GND, thereby deactivating the NMOS transistor NM of the second inverter INV2.

In this case, the control signal D is bit data of a part of the first offset correction signal OFD1 or the second offset correction signal OFD2, and is supplied both to the gate of the PMOS transistor PM2*a* and to the gate of the NMOS transistor NM2*a*. The control signal D is, seen from the PMOS transistor PM2*a*, a low-active signal and also is, seen from the NMOS transistor NM2*a*, a high-active signal, so that the PMOS transistor PM2*a* and the NMOS transistor NM2*a* are tuned on complementarily in response to the control signal D. In other words, when the DA converter 1053*j* performs D/A conversion of bit data of a low level (i.e. control signal D), among the pair of second switches SWP2, SWN2, the second switch SWP2 is turned on, and the second switch SWN2 is turned off. When the DA converter 1053*j* performs D/A conversion of a control signal D of a high level, among the pair of second switches SWP2, SWN2, the second switch SWN2 is turned on, and the second switch SWP2 is turned off.

As described above, according to the first embodiment, the DA converter 1053*j* and the amplifier 1052 share the output terminals OT1, OT2 and also share the input terminals IT1, IT2. Due to this, the D/A conversion unit DAUj of the DA converter 1053*j* generates offset correction signals through D/A conversion of offset correction data received at the control terminals CT1, CT2, amplifies signals received at the input terminals IT1, IT2, adds the amplified signals to the generated offset correction signals, and supplies the output terminals OT1, OT2 with the added signals. In other words, the DA converter 1053*j* can combine the function of generating offset correction signals through D/A conversion of offset correction data and the function of amplifying differential signals. This can not only suppress amplification of noise components included in the first offset correction signal OFS1*i* and the second offset correction signal OFS2*i*, but also increase effective signal components included in signals output from the first output terminal OT1 and the second output terminal OT2 as outputs of the mixer 105. In other words, the first embodiment can, compared with the configuration illustrated in FIGS. 12 and 13, selectively increase effective signal components included in signals output from the first output terminal OT1 and the second output terminal OT2 as outputs of the mixer 105 and thus further improve the SN ratio.

Furthermore, according to the first embodiment, the amplifier 1052 is a differential amplifier, which corrects a first direct current offset of the first DA converter 1054*j* and corrects a second direct current offset of the second DA converter 1055*j*. This makes it possible to realize the DA converter 1053*j* using a differential configuration conforming to the amplifier 1052.

Specifically, the first DA converter 1054*j* and the amplifier 1052 share the first output terminal OT1 and share the first input terminal IT1. Due to this, the first D/A conversion unit DAU1*j* of the first DA converter 1054*j* generates a first offset correction signal OFS1*j* through D/A conversion of first offset correction data OFD1 received at the first control terminal CT1, amplifies a first signal received at the first input terminal IT1, adds the amplified first signal to the generated first offset correction signal OFS1*j*, and supplies the first output terminal OT1 with the added signal. In other words, the first DA converter 1054*j* can combine the function of generating a first offset correction signal OFS1*j* through D/A conversion of first offset correction data OFD1 and the function of amplifying a first signal of a differential signal.

Furthermore, the second DA converter 1055*j* and the amplifier 1052 share the second output terminal OT2 and share the second input terminal IT2. Due to this, the second D/A conversion unit DAU2*j* of the second DA converter 1055*j* generates a second offset correction signal OFS2*j* through D/A conversion of second offset correction data OFD2 received at the second control terminal CT2, amplifies a second signal received at the second input terminal IT2, adds the amplified second signal to the generated second offset correction signal OFS2*j*, and supplies the second output terminal OT2 with the added signal. In other words, the second DA converter 1055*j* can combine the function of generating a second offset correction signal OFS2*j* through D/A conversion of second offset correction data OFD2 and the function of amplifying a second signal of a differential signal.

According to the first embodiment, furthermore, the amplifier 1052 includes a plurality of first inverters INV1-1 to INV1-6 and a plurality of pairs of first switches SWP1-1, SWN1-1 to SWP1-6, SWN1-6 connecting the plurality of first inverters INV1-1 to INV1-6 to the P-side power source and the N-side power source. Furthermore, the DA converter 1053*j* includes a plurality of second inverters INV2-7 to INV2-10 and a plurality of pairs of second switches SWP2-7, SWN2-7 to SWP2-10, SWN2-10 connecting the plurality of second inverters INV2-7 to INV2-10 to the P-side power source and the N-side power source. This makes it possible to make the unit cells UC1 of the amplifier 1052 and the unit cells UC2 of the DA converter 1053*j* similar to each other: for example, the unit cells UC2 can be designed by substituting the control line of the control signal PO_N and the control signal PO concerning the unit cells UC1 for the control line of the control signal D, thereby shortening the period of time to design the DA converter 1053*j* and the amplifier 1052.

According to the first embodiment, furthermore, the amplifier 1052 turns on both of each pair of the plurality of pairs of first switches SWP1-1, SWN1-1 to SWP1-6, SWN1-6, while the DA converter turns on one of each pair of the plurality of pairs of second switches SWP2-7, SWN2-7 to SWP2-10, SWN2-10 in response to offset correction data OFD1, OFD2 received at the control terminals CT1, CT2. This makes it possible to employ similar unit cells UC1, UC2 for the amplifier 1052 and the DA converter 1053*j* and also to realize suitable operations conforming to respective functions.

It should be noted that, in the configuration illustrated in FIG. 5B, the control signal D may be a logical inverse of bit data of a part of the first offset correction signal OFD1 or the second offset correction signal OFD2. In this case, when the DA converter 1053*j* performs D/A conversion of bit data (i.e. logical inverse of the control signal D) of a low level, the second switch SWN2 of the pair of second switches SWP2, SWN2 is turned on, and the second switch SWP2 is turned off. When the DA converter 1053*j* performs D/A conversion of bit data (i.e. logical inverse of the control signal D) of a high level, the second switch SWP2 of the pair of second switches SWP2, SWN2 is turned on, and the second switch SWN2 is turned off.

Second Embodiment

Figure 6:
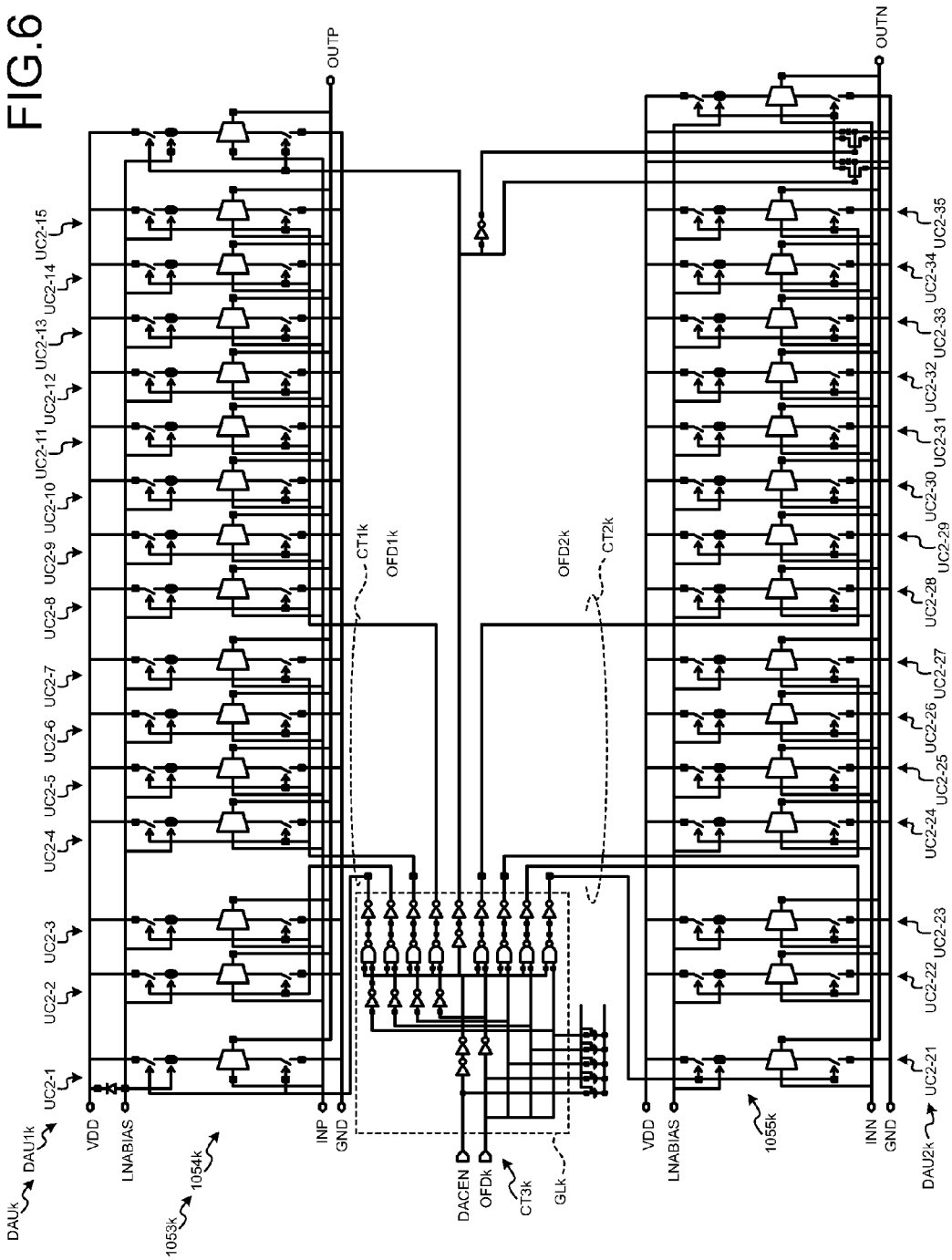
FIG. 6 is a diagram illustrating a configuration of a DA converter according to a second embodiment.

Next, a DA converter 1053*k* according to a second embodiment will be described with reference to FIG. 6. FIG. 6 is a diagram illustrating a configuration of the DA converter 1053*k*. The following description will focus on differences from the first embodiment.

According to the first embodiment, each unit cell of the DA converter 1053*j* is used to perform D/A conversion of offset correction data, but, according to the second embodiment, the range of D/A convertible values is enlarged by selecting unit cells, through binary weight allocation, from a plurality of unit cells of the DA converter 1053*k*.

Specifically, as illustrated in FIG. 6, the D/A conversion unit DAU*k* of the DA converter 1053*j* includes a plurality of unit cells UC2-1 to UC2-35. In other words, the first DA converter 1054*k* has, as units selectable in response to first offset correction data OFD1*k*, one unit cell UC2-1, two unit cells UC2-2, UC2-3, four unit cells UC2-4 to UC2-7, and eight unit cells UC2-8 to UC2-15. The second DA converter 1055*k* has, as units selectable in response to second offset correction data OFD2*k*, one unit cell UC2-21, two unit cells UC2-22, UC2-23, four unit cells UC2-24 to UC2-27, and eight unit cells UC2-28 to UC2-35.

Also, the configuration inside respective unit cells UC2-1 to UC2-35 is similar to the configuration according to the first embodiment, illustrated in FIG. 5B. Furthermore, although not illustrated, the DA converter 1053*k* and the amplifier 1052 share the output terminals OT1, OT2 and also share the input terminals IT1, IT2 in similar manner to in the case of the first embodiment.

According to the first embodiment, in the case of the configuration illustrated in FIG. 2, for example, two unit cells UC1 are provided on the side of the first input terminal IT1 (side of the first DA converter 1054*j*) and on the side of the second input terminal IT2 (side of the second DA converter 1055*j*), respectively. It is thought, due to this, that, on the side of the first input terminal IT1, for example, there are four types of combination of transistors (PM, PM), (PM, NM), (NM, PM), (NM, NM), which are activated in response to two-bit values of first offset correction data OFD1 "11", "10", "01", "00", for example, and there are four levels of obtainable analog values.

In contrast, according to the second embodiment, as illustrated in FIG. 6, on the side of the first input terminal IT1 (side of the first DA converter 1054*k*), for example, one unit cell UC2-1, two unit cells UC2-2, UC2-3, four unit cells UC2-4 to UC2-7, and eight unit cells UC2-8 to UC2-15 are provided as units selectable in response to first offset correction data OFD1*k*. In other words, the first DA converter 1054*k* can change the number of unit cells, by allocating binary weights, in response to each bit value of first offset correction data OFD1*k* of four bits received at the control terminal CT1*k*, for example, and control the unit cells. Likewise, the second DA converter 1055*k* can select unit cells, through binary weight allocation, in response to each bit value of first offset correction data OFD2$k$ of four bits received at the control terminal CT2$k$, for example, and control the unit cells.

For example, when the first offset correction data OFD1$k$ is "0000", no unit cells are selected for NMOS transistors NM (see FIG. 5B); one unit cell UC2-1, two unit cells UC2-2, UC2-3, four unit cells UC2-4 to UC2-7, and eight unit cells UC2-8 to UC2-15 are selected for PMOS transistors PM (see FIG. 5B), and the PMOS transistors PM of the selected fifteen unit cells UC2-1 to UC2-15 are activated.

For example, when the first offset correction data OFD1$k$ is "0001", one unit cell UC2-1 is selected, and the NMOS transistor NM (see FIG. 5B) of the selected one unit cell UC2-1 is activated; two unit cells UC2-2, UC2-3, four unit cells UC2-4 to UC2-7, and eight unit cells UC2-8 to UC2-15 are selected, and the PMOS transistors PM (see FIG. 5B) of the selected fourteen unit cells UC2-2 to UC2-15 are activated.

For example, when the first offset correction data OFD1$k$ is "0010", two unit cells UC2-2, UC2-3 are selected, and the NMOS transistors NM (see FIG. 5B) of the selected two unit cells UC2-2, UC2-3 are activated; one unit cell UC2-1, four unit cells UC2-4 to UC2-7, and eight unit cells UC2-8 to UC2-15 are selected, and the PMOS transistors PM (see FIG. 5B) of the selected thirteen unit cells UC2-1, UC2-4 to UC2-15 are activated.

For example, when the first offset correction data OFD1$k$ is "0011", one unit cell UC2-1 and two unit cells UC2-2, UC2-3 are selected, and the NMOS transistors NM (see FIG. 5B) of the selected three unit cells UC2-1 to UC2-3 are activated; four unit cells UC2-4 to UC2-7 and eight unit cells UC2-8 to UC2-15 are selected, and the PMOS transistors PM (see FIG. 5B) of the selected twelve unit cells UC2-4 to UC2-15 are activated.

For example, when the first offset correction data OFD1$k$ is "1111", no unit cells are selected for PMOS transistors PM (see FIG. 5B); one unit cell UC2-1, two unit cells UC2-2, UC2-3, four unit cells UC2-4 to UC2-7, and eight unit cells UC2-8 to UC2-15 are selected for NMOS transistors NM (see FIG. 5B), and the NMOS transistors NM of the selected fifteen unit cells UC2-1 to UC2-15 are activated.

As described above, according to the second embodiment, the DA converter 1053$k$ selects unit cells, through binary weight allocation, from a plurality of unit cells of the DA converter 1053$k$ and controls the unit cells. This makes it possible to enlarge the range of D/A convertible values and further improve the precision of offset correction by the DA converter 1053$k$.

It should be noted that, as illustrated in FIG. 6, a third control terminal CT3$k$ and a gate logic circuit GL$k$ may be further provided at a previous stage of the first control terminal CT1$k$ and the second control terminal CT2$k$. The gate logic circuit GL$k$ may receive common offset correction data OFD$k$ from the control unit 120 (see FIG. 8) via the third control terminal CT3$k$, generate first offset correction data OFD1$k$ and second offset correction data OFD2$k$ from the offset correction data OFD$k$, and supply the first control terminal CT1$k$ and the second control terminal CT2$k$ with respective data. At this time, the gate logic circuit GL$k$ can make the first offset correction data OFD1$k$ and the second offset correction data OFD2$k$ become complementary data, corresponding bit values of which are logical inverse to each other.

Third Embodiment

Figure 7:
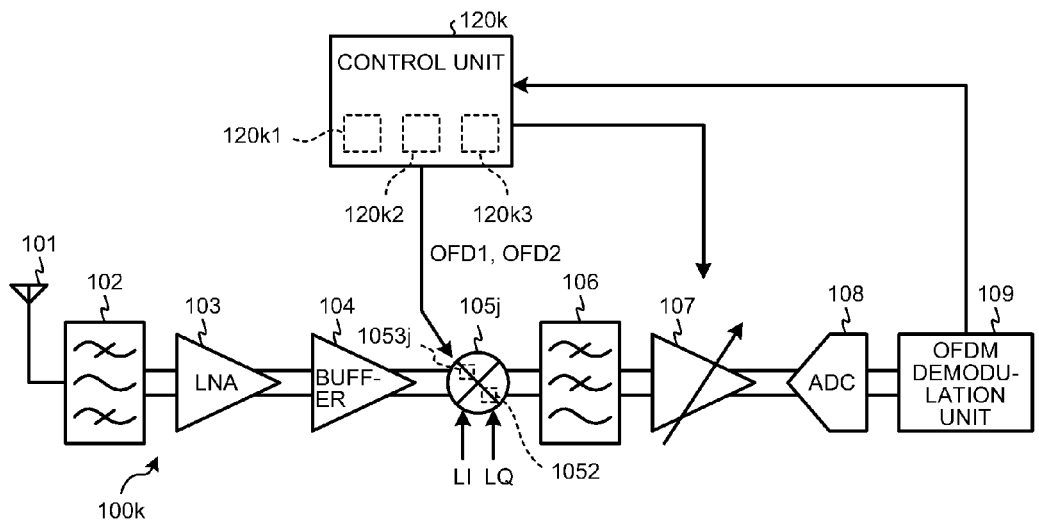
FIG. 7 is a diagram illustrating a configuration of a receiver including a mixer, to which a DA converter according to a third embodiment is applied.

Next, a receiver 100$k$ including a DA converter 1053$j$ according to a third embodiment will be described with reference to FIG. 7. FIG. 7 is a diagram illustrating a configuration of a receiver 100$k$ including a mixer 105$j$, to which a DA converter 1053$j$ according to a third embodiment is applied. The following description will focus on differences from the first embodiment.

According to the first embodiment, the offset correction data OFD1, OFD2 is predetermined experimentally and set in the control unit 120, but, according to the third embodiment, the offset correction data OFD1, OFD2 is dynamically determined by the control unit 120$k$.

Specifically, in connection with the receiver 100$k$, the control unit 120$k$ receives restored data from the OFDM demodulation unit 109. The control unit 120$k$, in response to the restored data, estimates the level of signals output from the amplifier 1052 and the DA converter 1053$j$ of the mixer 105$j$ (see FIG. 1). Then, the control unit 120$k$, in response to the estimated level of signals, determines offset correction data OFD1, OFD2 and supplies the DA converter 1053$j$ of the mixer 105$j$ with the determined data.

More specifically, the control unit 120$k$ includes a storage unit 120$k$1, an estimation unit 120$k$2, and a determination unit 120$k$3. The storage unit 120$k$1 stores offset correlation information. The offset correction information refers to information indicating the correlation between the level of signals output from the amplifier 1052 and the DA converter 1053$j$ and the offset of the amplifier 1052, and is, for example, experimentally obtained in advance and stored in the storage unit 120$k$1.

The estimation unit 120$k$2 receives the restored data from the OFDM demodulation unit 109. The estimation unit 120$k$2 has, for example, preset characteristic parameters indicating characteristics of the low pass filter 106, the variable gain amplifier 107, the AD converter 108, and the OFDM demodulation unit 109. The estimation unit 120$k$2, in response to the restored data and the characteristic parameters, estimates the level of signals output from the amplifier 1052 and the DA converter 1053$j$ of the mixer 105$j$ (see FIG. 1). The estimation unit 120$k$2 supplies the determination unit 120$k$3 with the estimated level of signals.

The determination unit 120$k$3 receives the estimated level of signals from the estimation unit 120$k$2. The determination unit 120$k$3 accesses the storage unit 120$k$1 and obtains the offset correlation information. The determination unit 120$k$3, in response to the estimated level of signals and the offset correlation information, obtains the offset of the amplifier 1052 and, in order to cancel the offset of the amplifier 1052, determines values of offset correction data OFD1, OFD2. The determination unit 120$k$3 supplies the DA converter 1053$j$ of the mixer 105$j$ with the determined offset correction data OFD1, OFD2.

In response to this, the DA converter 1053$j$ generates offset correction signals OFS1$j$, OFS2$j$ through D/A conversion of the offset correction data OFD1, OFD2 determined by the control unit 120$k$ and amplifies signals received at the input terminals IT1, IT2.

As described above, according to the third embodiment, the control unit 120$k$ controls the DA converter 1053$j$ in response to the level of signals output from the amplifier 1052 and the DA converter 1053$j$. Specifically, the control unit 120$k$ estimates the level of signals output from the amplifier 1052 and the DA converter 1053$j$ in response to the restored data and determines offset correction data OFD1, OFD2 in response to the estimated level of signals. This makes it possible to dynamically determine, so as to cope with dynamic changes of the offset of the amplifier 1052, offset correction data OFD1, OFD2 so as to cancel the offset of the amplifier 1052. As a result, the precision of offset correction can be improved when the offset of the amplifier 1052 changes dynamically.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first amplifier having an input terminal to receive a first signal and an output terminal to output a second signal, the second signal being obtained by amplifying the first signal; and
    a second amplifier configured to receive the first signal and a correction data, to generate a correction signal according to the first signal and the correction data, and to output the generated correction signal to the output terminal of the first amplifier so as to add the second signal and the generated correction signal.

2. The semiconductor device according to claim 1, further comprising:
    a frequency conversion circuit coupled to the input terminal of the first amplifier, the frequency conversion circuit mixing a third signal and a local oscillation signal to output the first signal.

3. The semiconductor device according to claim 2, further comprising:
    a control unit coupled to the second amplifier, the control unit being configured to generate the correction data according to a first data restored based on the second signal and the correction signal.

4. The semiconductor device according to claim 1, wherein each of the first signal and the second signal is an analog signal, and the correction data has a digital value.

5. The semiconductor device according to claim 2, wherein the third signal is a radio frequency signal.

6. The semiconductor device according to claim 1, wherein the first amplifier comprises:
    a plurality of first inverters coupled in parallel with each other between the input terminal and the output terminal; and
    a plurality of pairs of first switches configured to couple the plurality of first inverters to a P-side power source and an N-side power source, and
    the second amplifier comprises:
    a plurality of second inverters coupled in parallel with each other between the input terminal and the output terminal; and
    a plurality of pairs of second switches configured to couple the plurality of second inverters to the first power source and the second power source.

7. The semiconductor device according to claim 6, wherein the first amplifier is configured to turn on both of each pair of the plurality of pairs of first switches, and the second amplifier is configured to turn on either one of each pair of the plurality of pairs of second switches in response to the correction data.

8. The semiconductor device according to claim 7, wherein a plurality of bits of offset correction data received at the control terminal correspond to the plurality of pairs of second switches.

9. The semiconductor device according to claim 8, wherein, in each of the plurality of pairs of second switches, the second inverter is coupled to the second power source when a corresponding bit is high, and the second inverter is coupled to the first power source when the corresponding bit is low.

10. The semiconductor device according to claim 8, wherein, in each of the plurality of pairs of second switches, the second inverter is connected to the first power source when a corresponding bit is high, and the second inverter is connected to the second power source when the corresponding bit is low.

11. A semiconductor device comprising:
    a first amplifier having a first input terminal to receive a first signal and a first output terminal to output a second signal;
    a second amplifier having a second input terminal to receive a third signal and a second output terminal to output a fourth signal;
    a third amplifier configured to receive the first signal and a first correction data, to generate a first correction signal according to the first signal and the first correction data, and to output the generated first correction signal to the first output terminal of the first amplifier so as to add the first signal and the generated first correction signal; and
    a fourth amplifier configured to receive the third signal and a second correction data, to generate a second correction signal according to the third signal and the second correction data, and to output the generated second correction signal to the second output terminal of the second amplifier so as to add the third signal and the generated second correction signal.

12. The semiconductor device according to claim 11, further comprising:
    a frequency conversion circuit coupled to the first input terminal of the first amplifier and to the second input terminal of the second amplifier, the frequency conversion circuit mixing a fifth signal, a sixth signal, a first local oscillation signal, and a second local oscillation signal to output the first signal and the third signal.

13. The semiconductor device according to claim 12, further comprising:
    a control unit coupled to the third amplifier and the fourth amplifier, the control unit being configured to generate the first correction data according to a first data restored based on the second signal and the first correction signal, and to generate the second correction data according to a second data restored based on the third signal and the second correction signal.

14. The semiconductor device according to claim 11, wherein each of the first signal, the second signal, the third signal, and the fourth signal is an analog signal, and
    each of the first correction data and the second correction data has a digital value.

15. The semiconductor device according to claim 12, wherein
    each of the fifth signal and the sixth signal is a radio frequency signal, and
    a phase of the first local oscillation signal and a phase of the second local oscillation signal differs by substantially 90 degrees.

16. The semiconductor device according to claim 1, wherein
the first amplifier comprises a plurality of first unit cells coupled in parallel with each other between the input terminal and the output terminal,
each of the plurality of first unit cells comprises:
a first inverter coupled between the input terminal and the output terminal; and
a pair of first switches configured to connect the first inverter to the first power source and the second power source,
the second amplifier comprises a plurality of second unit cells coupled in parallel with each other between the input terminal and the output terminal, and
each of the plurality of second unit cells comprises:
a second inverter connected between the input terminal and the output terminal; and
a pair of second switches configured to connect the second inverter to the first power source and the second power source.

17. The semiconductor device according to claim 16, wherein the second amplifier is configured to control the second unit cells such that the second amplifier selects second unit cells through binary weight allocation from the plurality of second unit cells in response to correction data.

18. The semiconductor device according to claim 16, wherein the second amplifier is configured to turn on one of each pair of the plurality of pairs of second switches such that the second amplifier selects second unit cells through binary weight allocation from the plurality of second unit cells in response to the correction data.

19. A receiver comprising:
a first amplifier comprising an input terminal to receive a first signal and an output terminal to output a second signal;
a second amplifier configured to input the first signal and a correction data, generate a correction signal according to the first signal and the correction data, and output the correction signal to the output terminal of the first amplifier,
a frequency conversion circuit, coupled to the input terminal of the first amplifier, and outputting the first signal being mixed a third signal and an oscillation signal, and
a control unit, coupled to the second amplifier, configured to generate the correction data according to the second signal and a first data restored based on the second signal,
wherein the second amplifier is configured to correct a offset of the first amplifier according to the correction data.

20. The receiver according to claim 19, wherein the control unit comprises:
a storage unit configured to store offset correlation information indicating correlation between offsets of the first amplifier and levels of the second signal and the correction signal;
an estimation unit configured to estimate levels of the second signal and the correction signal; and
a determination unit configured to determine a value of the correction data according to the offset correlation information and the estimated levels of the second signal and the correction signal.

* * * * *